(12) United States Patent
Huh et al.

(10) Patent No.: US 10,516,400 B2
(45) Date of Patent: Dec. 24, 2019

(54) PHASE-LOCKED LOOP AND DELAY-LOCKED LOOP

(71) Applicant: Anapass Inc., Seoul (KR)

(72) Inventors: Hyung Ki Huh, Seoul (KR); Dong Joon Lee, Seoul (KR)

(73) Assignee: Anapass Inc., Seoul (KR)

( * ) Notice: Subject to any disclaimer, the term of this patent is extended or adjusted under 35 U.S.C. 154(b) by 0 days.

(21) Appl. No.: 16/181,625

(22) Filed: Nov. 6, 2018

(65) Prior Publication Data

US 2019/0165792 A1 May 30, 2019

(30) Foreign Application Priority Data

Nov. 27, 2017 (KR) .................. 10-2017-0159536

(51) Int. Cl.
*H03L 7/06* (2006.01)
*H03L 7/08* (2006.01)
*H03L 7/099* (2006.01)
*H03L 7/081* (2006.01)
*H03L 7/091* (2006.01)
*H03L 7/087* (2006.01)

(52) U.S. Cl.
CPC ............ *H03L 7/0802* (2013.01); *H03L 7/087* (2013.01); *H03L 7/0812* (2013.01); *H03L 7/0816* (2013.01); *H03L 7/091* (2013.01); *H03L 7/0992* (2013.01); *H03L 2207/18* (2013.01)

(58) Field of Classification Search
CPC ............. B41J 2202/20; B41J 2/04541; B41J 2/04563; B41J 2/04543; B41J 2/04505
See application file for complete search history.

(56) References Cited

U.S. PATENT DOCUMENTS

| | | | |
|---|---|---|---|
| 4,893,094 A * | 1/1990 | Herold | ............... H03L 3/00 331/1 A |
| 7,394,322 B2 * | 7/2008 | Beeson | ............... H03L 7/197 331/16 |
| 9,685,957 B2 | 6/2017 | How | |
| 2012/0293223 A1 | 11/2012 | Watanabe | |

OTHER PUBLICATIONS

Korean Office Action for related KR Application No. 10-2017-0159536 dated Jul. 27, 2018 from Korean Patent Office.
Reza Navid et al., "A 25GHz 100ns Lock Time Digital LC PLL with an 8-phase Output Clock", 2013 Symposium on VLSI Circuits, Jun. 2013, pp. C196-C197.

* cited by examiner

*Primary Examiner* — Sibin Chen
(74) *Attorney, Agent, or Firm* — Paratus Law Group, PLLC

(57) ABSTRACT

Disclosed is a phase-locked loop and a delay-locked loop. When the phase-locked loop switches from a sleep state to an active state, a frequency of a reference signal is the same as a frequency of a reference signal which has been synchronized in a previous active state. The phase-locked loop alternately operates in a sleep state and an active state. A frequency-divided output signal of the phase-locked loop is synchronized with a frequency-divided reference signal, when the phase-locked loop switches from a sleep state to an active state, a frequency of the frequency-divided output signal is identical to a frequency of a frequency-divided output signal which has been synchronized in a previous active state. Information corresponding to the frequency of the frequency-divided output signal which has been synchronized in the previous active state is stored in a capacitor.

3 Claims, 16 Drawing Sheets

PHASE-LOCKED LOOP AND DELAY-LOCKED LOOP

CROSS-REFERENCE TO RELATED APPLICATION

This application claims priority to and the benefit of Korean Patent Application No. 10-2017-0159536, filed on Nov. 27, 2017, the disclosure of which is incorporated herein by reference in its entirety.

BACKGROUND

1. Field of the Invention

The present disclosure relates to a phase-locked loop and a delay-locked loop.

2. Discussion of Related Art

A phase-locked loop (PLL) refers to a system that controls an output signal using a phase difference between a reference signal and a signal which is obtained by frequency-dividing the output signal and then fed back. The PLL detects a phase difference between a frequency-division result of the output signal and an input signal, determines the detected phase difference as an error, and adjusts an input voltage of a voltage controlled oscillator so that the error may be reduced. In this way, an output frequency is changed. When the phase difference between the input and the feedback of the output becomes 0, phases are locked, and the output signal is adjusted so that the locked state may be maintained. A frequency difference between the input and the output varies according to a frequency divider. The frequency of the output signal is controlled according to a division ratio of the frequency divider. In most PLLs, an output is oscillated at a higher frequency than an input.

During an operation of an analog PLL, a reference signal is provided as any one input of a phase frequency detector (PFD), and an output signal of a frequency divider having a different phase and/or frequency than the reference signal is provided as another input.

The PFD outputs an error signal by detecting a difference in phase and/or frequency between the reference signal and the output signal of the frequency divider. A charge pump (CP) receives the error signal and outputs a current signal corresponding to the error signal, and a loop filter (LF) outputs a control signal by eliminating unnecessary frequencies from the current signal to control a voltage controlled oscillator (VCO). The VCO outputs a signal having a frequency corresponding to the control signal output by the LF and provides the signal to the frequency divider for a feedback to the PFD.

A delay-locked loop (DLL) is a circuit used to change a phase of a clock signal. In general, a DLL is used as a clock buffer in an integrated circuit or used in a clock-data recovery (CDR) circuit. A DLL includes a delay chain in which a plurality of delay elements are cascaded. A signal provided as an input is delayed by the delay elements, and a signal having a target phase is output.

SUMMARY

When a signal having a different frequency and/or phase than a reference signal is provided, an existing PLL or DLL outputs a signal having a target frequency and/or phase through numerous iterations. At this point in time, the PLL or DLL is referred to as "locked," and a period of time to the point in time is referred to as "locking time."

The PLL or DLL alternately operates in a sleep state and an active state. Every time the PLL or DLL is restarted from the sleep state to the active state, the locking time is consumed, and thus it is difficult for the PLL or DLL to rapidly restart. It is possible to maintain frequency and/or phase synchronization by continuously keeping the PLL or DLL in the active state, but unnecessary power is consumed.

The present invention is directed to providing a phase-locked loop (PLL) and a delay-locked loop (DLL) which alternately operate in a sleep state and an active state and may rapidly operate due to a reduced locking time when it is necessary to restart from a sleep state to an active state.

The present invention is also directed to providing a PLL and a DLL for reducing power consumption in a sleep state.

According to an aspect of the present invention, there is provided a PLL which alternately operates in a sleep state and an active state and synchronizes a frequency-divided output signal of the PLL with a frequency-divided reference signal. A frequency of an output signal frequency-divided when the PLL switches from a sleep state to an active state is the same as a frequency of a frequency-divided output signal which has been synchronized in a previous active sate.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

The following descriptions of the present invention are merely exemplary embodiments for structural or functional descriptions, and the scope of the present invention should not be construed as being limited to the exemplary embodiments set forth herein. In other words, exemplary embodiments may be diversely changed and have various forms, and the scope of the present invention should be understood as including equivalents to realize the technical idea.

Meanwhile, terminology described in this application is to be understood as follows.

Terms such as "first," "second," etc. are used to distinguish one element from other elements, and the scope of the present invention should not be limited by these terms. For example, a first element may be referred to as a second element, and similarly, a second element may be referred to as a first element.

As used herein, the singular forms are intended to include the plural forms as well, unless the context clearly indicates otherwise. The terms "comprise," "include," or the like when used in this specification, specify the presence of stated features, numbers, operations, elements, parts, or combinations thereof, but do not preclude the presence or addition of one or more other features, numbers, operations, elements, parts, or combinations thereof.

The term "and/or" is used to indicate all possible combination of items present. For example, "A and/or B" should be understood to indicate "A, B, and both A and B."

In describing embodiments of the present invention, a single line, a differential line, and a bus are not distinguished from each other. However, they will by described when it is necessary to distinguish them from each other.

The present invention is described on the basis of active high signaling and rising edge sampling. Therefore, states of a signal are implemented when the signal is in a high level, and sampling is performed at a rising edge. However, these are intended for convenience of description and are not intended in any way to limit the scope of the present invention. Further, those of ordinary skill in the art may implement the present invention by using active low signaling and falling edge sampling.

First Exemplary Embodiment

Figure 1:
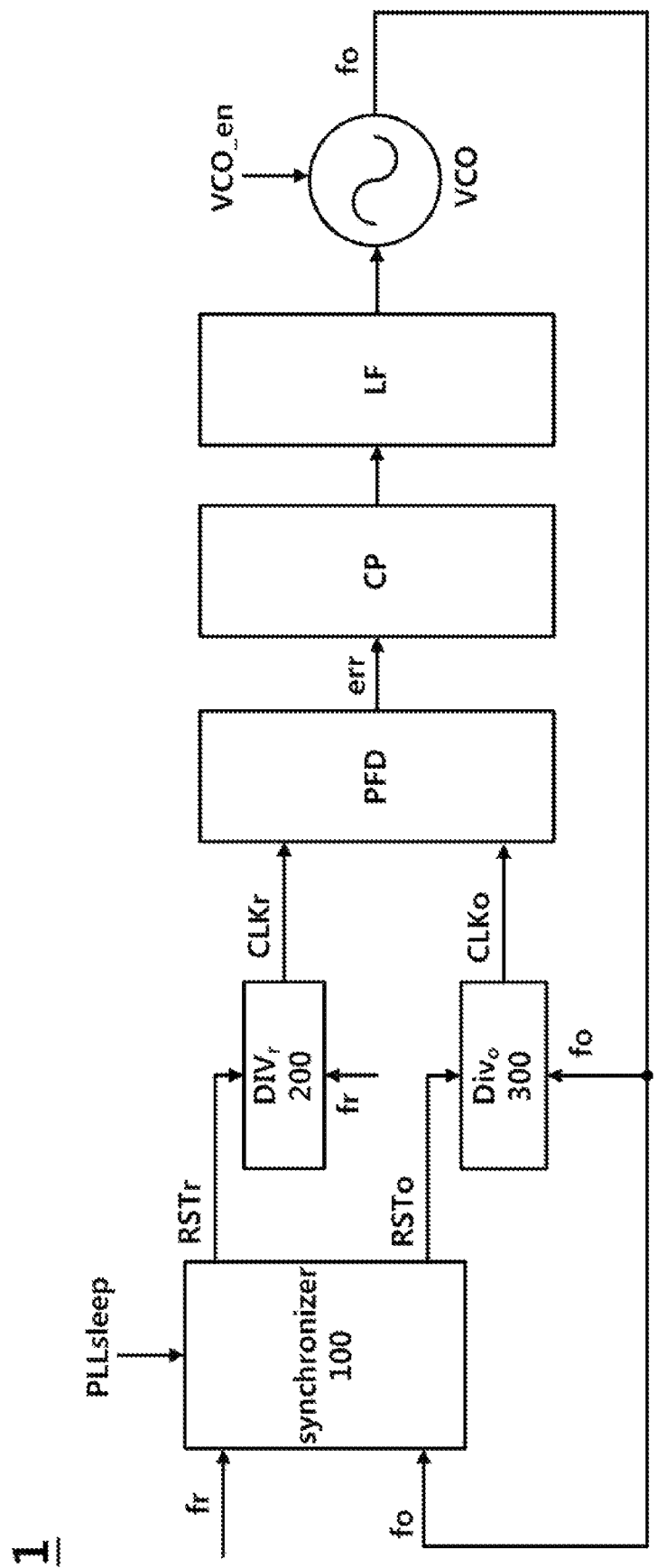
FIG. 1 is a block diagram showing an overview of a phase-locked loop (PLL) according to an exemplary embodiment of the present invention.

A phase-locked loop (PLL) 1 according to the present embodiment will be described below with reference to accompanying drawings. FIG. 1 is a block diagram showing an overview of the PLL 1 according to the present embodiment. Referring to FIG. 1, the PLL 1 according to the present embodiment includes an output signal frequency divider 300 which divides a frequency of an output signal fo of the PLL 1, a reference signal frequency divider 200 which divides a frequency of a reference signal fr, and a synchronizer 100 which provides a reference signal frequency divider reset signal RSTr for initializing the reference signal frequency divider 200 by sampling a sleep signal PLLsleep with the reference signal fr and provides an output signal frequency divider reset signal RSTo for initializing the output signal frequency divider 300 by sampling the reference signal frequency divider reset signal RSTr with the output signal fo. The PLL 1 synchronizes the output signal fo with the reference signal fr using a frequency-divided output signal CLKo output by the output signal frequency divider 300 and a frequency-divided output signal CLKr output by the reference signal frequency divider 200.

A phase frequency detector PFD receives the frequency-divided reference signal CLKr and the frequency-divided output signal CLKo provided as input and detects a frequency difference and/or a phase difference between the two signals. The phase frequency detector PFD outputs an error signal err corresponding to the detected frequency difference and/or phase difference.

As an example, when a frequency and/or phase of the frequency-divided output signal CLKo lags behind a frequency and/or phase of the frequency-divided reference signal CLKr, the error signal err may be a pump-up signal for controlling a following charge pump CP to provide electric charges. As another example, when the frequency and/or phase of the frequency-divided output signal CLKo precedes the frequency and/or phase of the frequency-divided reference signal CLKr, the error signal err may be a pump-down signal for controlling the charge pump CP to receive electric charges.

FIGS. 2A, 2B, 2C, and 2D are circuit diagrams showing overviews of loop filters LF. A loop filter LF receives a signal output from the charge pump CP and generates a control signal for controlling a voltage controlled oscillator VCO. Since the signal output from the charge pump CP includes high-band noise components as well as components for controlling the voltage controlled oscillator VCO, the noise is removed using the loop filter LF having a low-bandpass characteristic. The signal provided by the charge pump CP is accumulated by the loop filter LF so that a voltage signal may be generated, and the voltage signal controls a frequency output from the voltage controlled oscillator VCO.

Figure 2A:
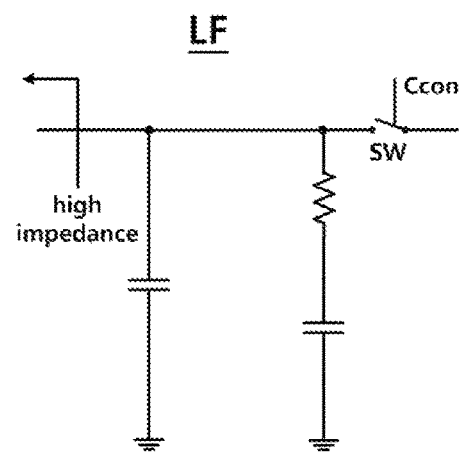
FIGS. 2A, 2B, 2C, and 2D are circuit diagrams showing overviews of loop filters.
Figure 2B:
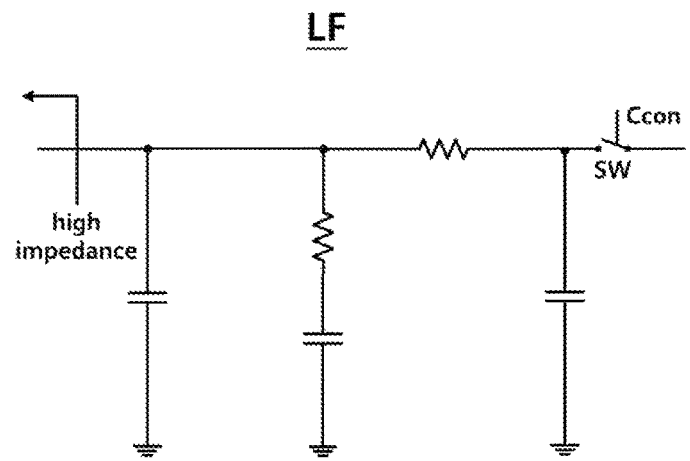

Referring to exemplary embodiments shown in FIGS. 2A and 2B, a voltage formed at the loop filter LF corresponds to the frequency output by the voltage controlled oscillator VCO. When the PLL 1 alternately operates in an active state and a sleep state, phase alignment is achieved in an active state. Subsequently, when or after the PLL 1 enters a sleep state, a control signal Ccon is provided to turn off a switch SW.

A stage subsequent to the loop filter LF is blocked by the switch SW, and an output side of the previous stage of the loop filter LF has a high output impedance. Therefore, it is possible to minimize discharge of electric charges stored in the loop filter LF and maintain frequency information of a case in which phase alignment has been achieved.

When the PLL 1 switches from the sleep state to an active state, the control signal Ccon is provided to turn on the switch SW. Then, the loop filter LF may control the voltage controlled oscillator VCO to output a signal having the same frequency as a signal output by the voltage controlled oscillator VCO in the previous active state.

According to an exemplary embodiment, the switch SW may be implemented as an electronic device in which whether one electrode is connected to another electrode is controlled by a signal provided to a control electrode. As an example, the switch SW may be a metal oxide semiconductor (MOS) transistor. The control signal Ccon for controlling whether to turn on or off the switch SW may be provided by a controller (not shown) including a control logic. According to another exemplary embodiment, the control signal Ccon for controlling whether to turn on or off the switch SW may be provided by the synchronizer 100 which has received the sleep signal PLLsleep.

Figure 2C:
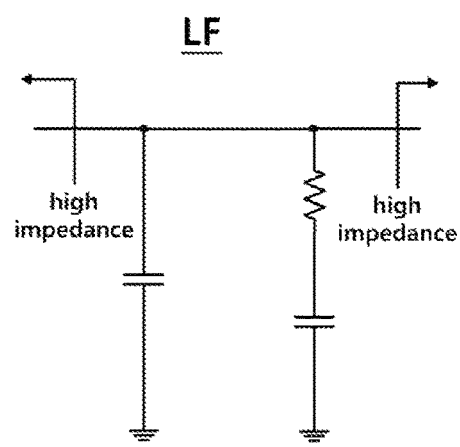
Figure 2D:
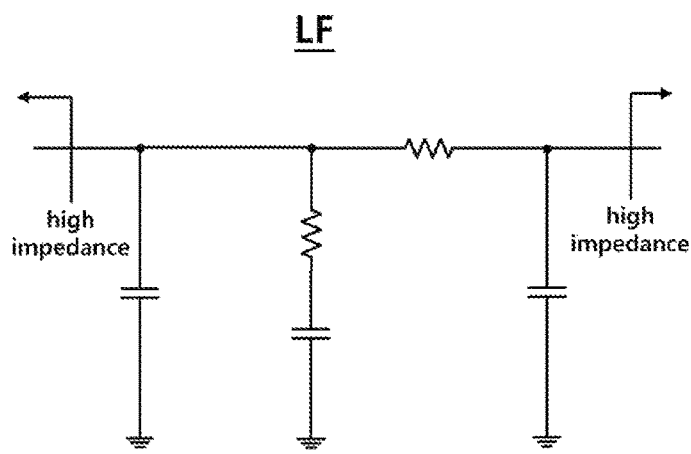

Referring to exemplary embodiments shown in FIGS. 2C and 2D, output sides of the previous and subsequent stages of the loop filter LF have high output impedances. Therefore, it is possible to minimize discharge of electric charges stored in the loop filter LF, and the loop filter LF may maintain frequency information of a case in which phase alignment has been achieved.

Figure 3:
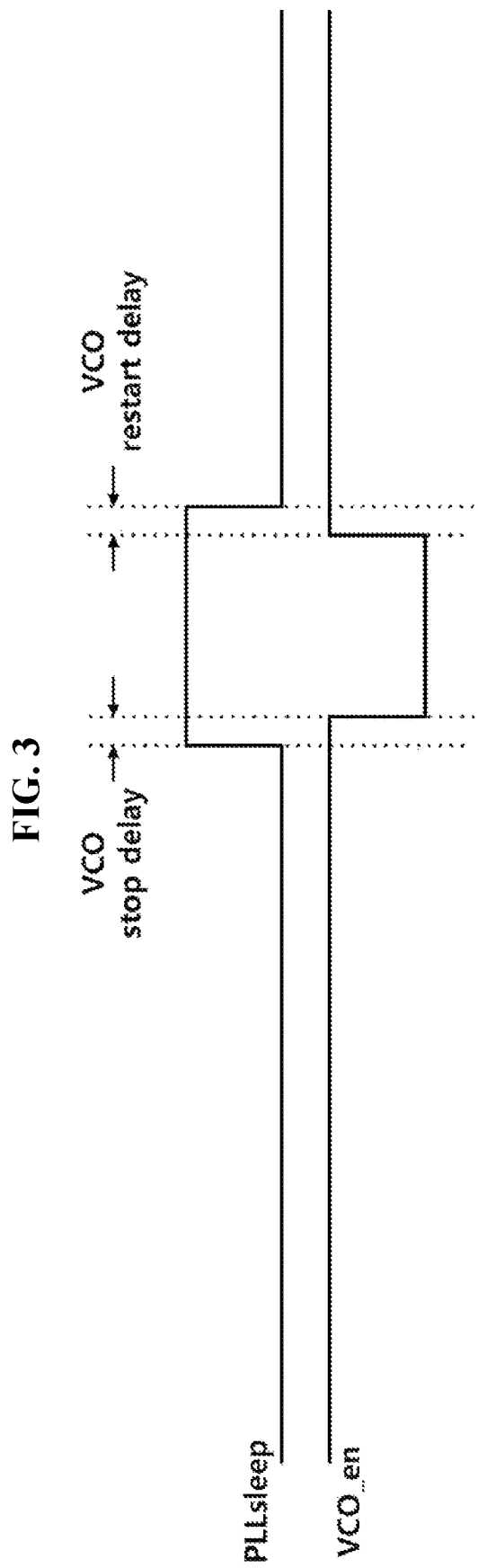
FIG. 3 is a timing diagram showing a sleep signal and a voltage control oscillator activation signal for controlling activation of a voltage controlled oscillator.

FIG. 3 is a timing diagram showing the sleep signal PLLsleep and a VCO activation signal VCO_en for controlling activation of the voltage controlled oscillator VCO. Referring to FIG. 3, after the sleep signal PLLsleep is provided, a period of time for which it is possible to deactivate the voltage controlled oscillator VCO is determined by a VCO stop delay time. When the sleep signal PLLsleep is provided and then the VCO stop delay time elapses, the voltage controlled oscillator VCO may be deactivated, and power consumption of the voltage controlled oscillator VCO may be reduced accordingly. Also, to ensure a restart time of the voltage controlled oscillator VCO, the sleep signal PLLsleep is switched to a low level after a VCO restart delay time elapses so that the PLL 1 may switch from the sleep state.

Figure 4:
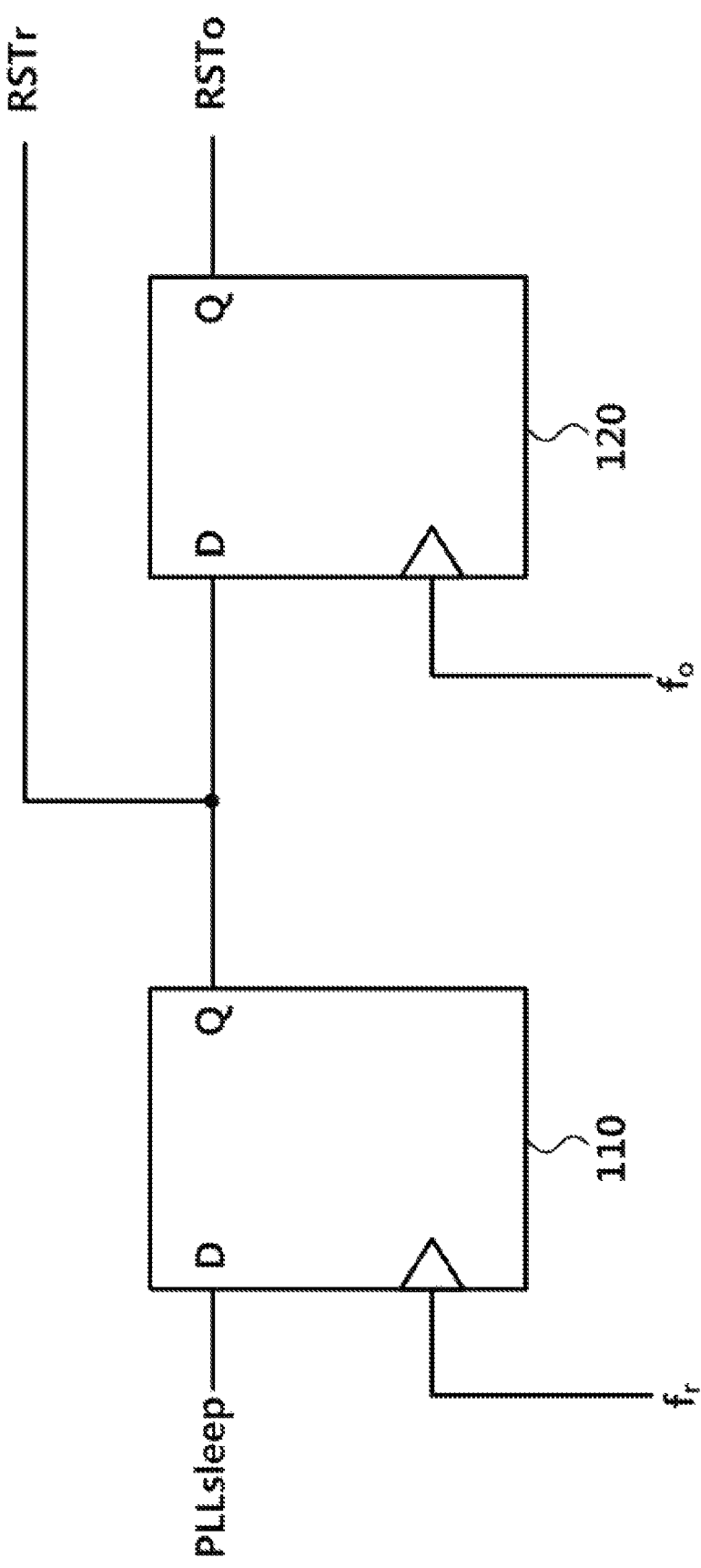
FIG. 4 is a circuit diagram showing an overview of a synchronizer.

FIG. 4 is a circuit diagram showing an overview of the synchronizer 100. Referring to FIGS. 1 and 4, the output signal fo, the reference signal fr, and the sleep signal PLLsleep of the PLL 1 are provided to the synchronizer 100. According to an exemplary embodiment, the synchronizer 100 may include a first D flip-flop 110 which outputs the reference signal frequency divider reset signal RSTr by sampling the sleep signal PLLsleep with the reference signal fr, and a second D flip-flop 120 which outputs the output signal frequency divider reset signal RSTo by sampling the reference signal frequency divider reset signal RSTr with the output signal fo.

In the embodiment shown as an example in FIG. 4, the first D flip-flop 110 samples the sleep signal PLLsleep on rising edges of the reference signal fr, and the second D flip-flop 120 samples the reference signal frequency divider reset signal RSTr on rising edges of the output signal fo. Therefore, a level of the reference signal frequency divider reset signal RSTr and a level of the output signal frequency divider reset signal RSTo may be changed within one cycle of the output signal fo.

According to an exemplary embodiment, the reference signal fr is an output signal of an oscillator and has a predetermined frequency. As an example, the oscillator may be any one of a crystal oscillator (XO; not shown) and a temperature-compensated crystal oscillator (TCXO).

Referring back to FIG. 1, the reference signal frequency divider 200 receives the reference signal fr, divides a frequency of the reference signal fr according to a predetermined frequency division ratio, and outputs the frequency-divided reference signal CLKr. The output signal frequency divider 300 receives the output signal fo, divides a frequency of the output signal fo according to a predetermined frequency division ratio, and outputs the frequency-divided output signal CLKo. Therefore, when the PLL 1 restarts in a sleep state, the voltage controlled oscillator VCO provides the output signal fo having the same frequency as in the previous synchronized state, and the frequency division ratio of the output signal frequency divider 300 is constant. Therefore, a frequency of the frequency-divided output signal CLKo is the same as in the previous synchronized state.

Figure 5:
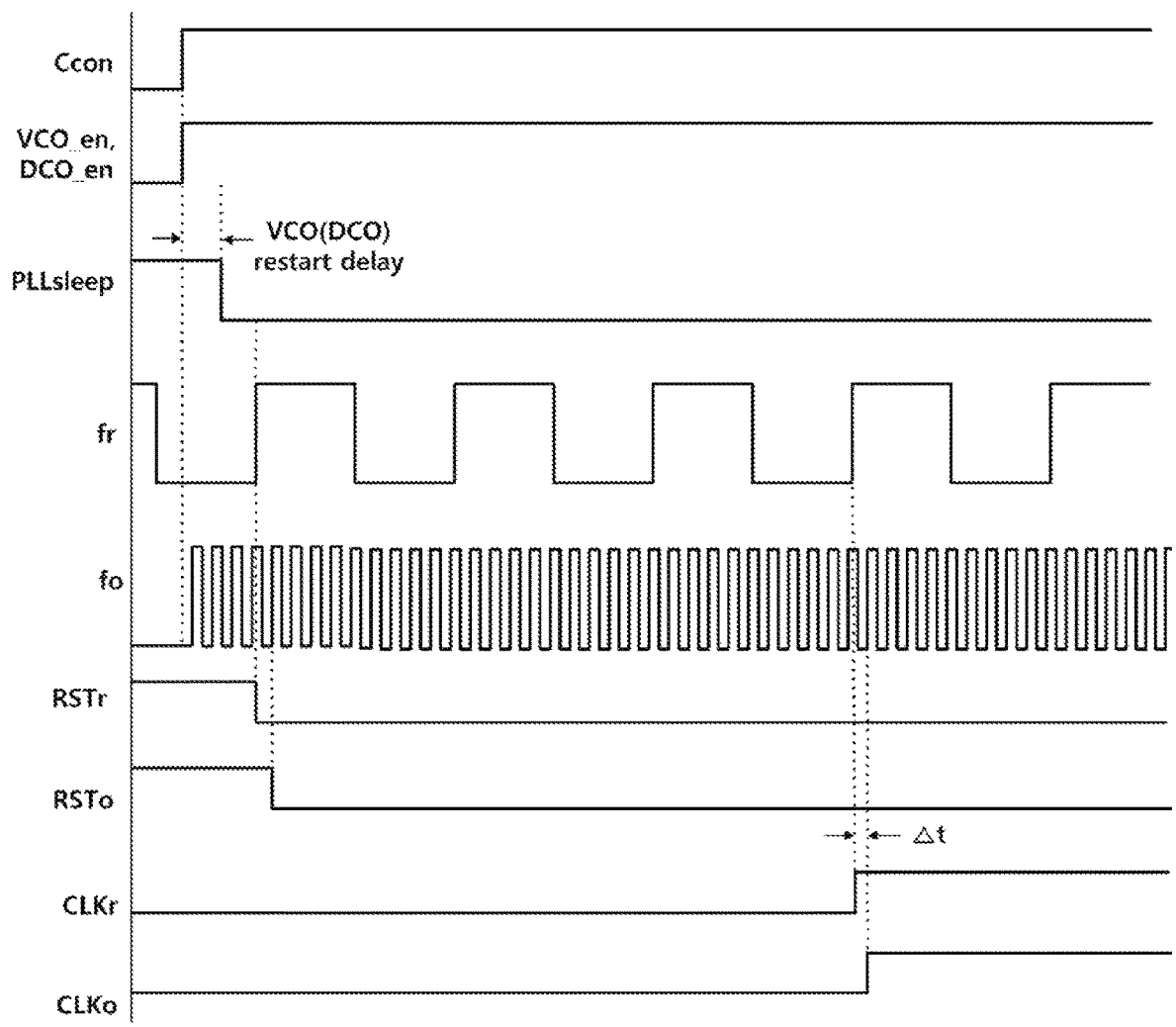
FIG. 5 is a timing diagram of a PLL according to an exemplary embodiment of the present invention.

A restart operation of the PLL 1 according to the present embodiment will be described below with reference to FIGS. 1 to 5. FIG. 5 is a timing diagram of the PLL 1 according to the present embodiment. To restart the PLL 1 in a sleep state, the controller (not shown) provides the control signal Ccon and the VCO activation signal VCO_en so that the switch SW may be turned on and the voltage controlled oscillator VCO may be activated. After the VCO restart delay time elapses, the sleep signal PLLsleep is switched to a low level so that the synchronizer 100 may be activated.

When the synchronizer 100 is activated, the sleep signal PLLsleep at the low level is sampled on rising edges of the reference signal fr to generate the reference signal frequency divider reset signal RSTr at a low level. The reference signal frequency divider reset signal RSTr is provided to the reference signal frequency divider 200 and activates the reference signal frequency divider 200. The reference signal frequency divider reset signal RSTr at the low level is sampled on rising edges of the output signal fo to generate the output signal frequency divider reset signal RSTo at a low level. The output signal frequency divider reset signal RSTo is provided to the output signal frequency divider 300 and activates the output signal frequency divider 300.

Since a phase difference between the reference signal frequency divider reset signal RSTr and the output signal frequency divider reset signal RSTo is within one cycle of the output signal fo, the reference signal frequency divider 200 and the output signal frequency divider 300 may be activated within one cycle of the output signal fo. Therefore, a phase difference $\Delta t$ between the signals output by the activated reference signal frequency divider 200 and output signal frequency divider 300 may be kept smaller than that of a related art. As a result, it is possible to reduce a time required for phase locking.

Second Exemplary Embodiment

A second exemplary embodiment of the present invention will be described below with reference to accompanying drawings. For clear and simple description, descriptions identical or similar to those of the first exemplary embodiment will be omitted, and elements which perform like or similar functions may be described with reference to drawings of the previous embodiment.

Figure 6:
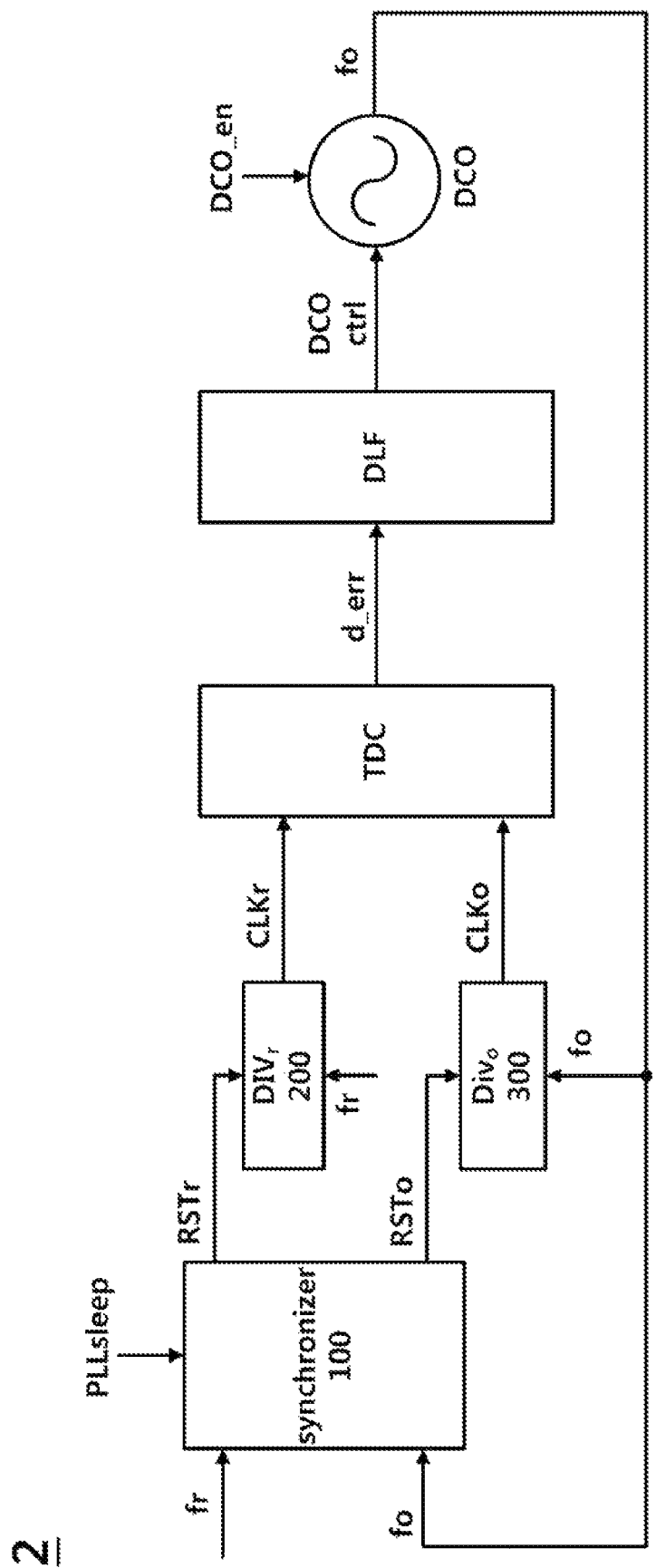
FIG. 6 is a diagram showing an overview of a digital PLL according to a second exemplary embodiment of the present invention.

FIG. 6 is a diagram showing an overview of a digital PLL 2 according to the second exemplary embodiment of the present invention. Referring to FIG. 6, the digital PLL 2 includes a synchronizer 100, a reference signal frequency divider 200, an output signal frequency divider 300, a time-to-digital converter TDC, a digital loop filter DLF, and a digitally controlled oscillator DCO.

The time-to-digital converter TDC receives a frequency-divided reference signal CLKr and a frequency-divided output signal CLKo provided as input. The time-to-digital converter TDC detects a frequency difference and/or a phase difference between the provided input signals and outputs an error code d_err corresponding to the detected frequency difference and/or phase difference.

Figure 7:
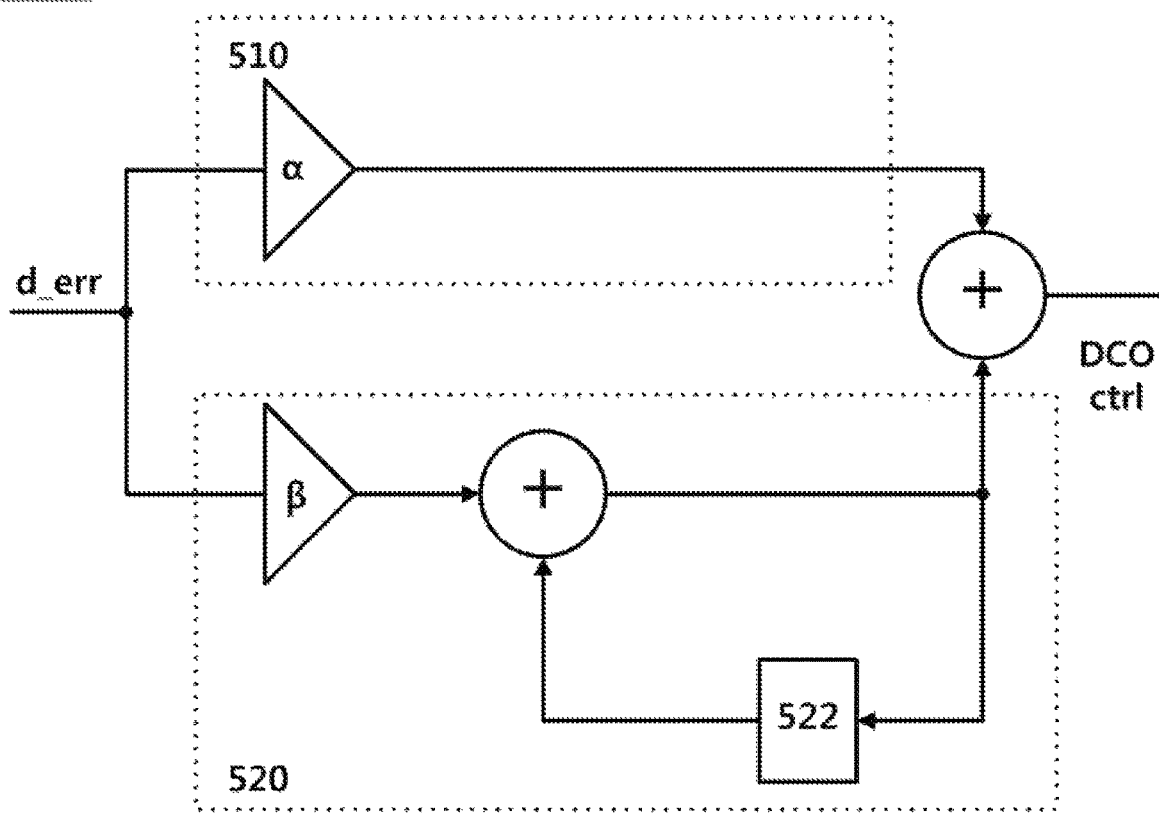
FIG. 7 is a circuit diagram schematically showing an exemplary embodiment of a digital loop filter.

FIG. 7 is a circuit diagram schematically showing the digital loop filter DLF according to the present embodiment. Referring to FIG. 7, the digital loop filter DLF receives the error code d_err as an input and generates a control code DCOctrl for controlling the digitally controlled oscillator DCO by removing noise included in the error code d_err. According to an exemplary embodiment, the digital loop filter DLF may function as a low-pass filter.

According to an exemplary embodiment, the digital loop filter DLF includes a proportional path 510 and an integral path 520 including a memory device 522. The proportional path 510 has a gain of $\alpha$ and corresponds to a resistance of the loop filter LF of the first exemplary embodiment implemented as an analog circuit, thus adjusting an instantaneous phase. The integral path 520 has a gain of β and corresponds to a capacitor of the loop filter LF of the first exemplary embodiment implemented as an analog circuit, thus adjusting a frequency of an output of the digitally controlled oscillator DCO.

The memory device 522 included in the integral path 520 stores a signal output from the integral path 520. The memory device 522 may store the signal output from the integral path 520 before the digital PLL 2 enters a sleep state, thereby storing output frequency information of a case in which phase alignment has been finished. As an exemplary embodiment, the memory device 522 may be a register including one or more D flip-flops. The memory device 522 samples and holds information output from the integral path 520 before the digital PLL 2 enters a sleep state. When the digital PLL 2 deviates from the sleep state, the digital loop filter DLF may generate the control code DCOctrl for controlling the digitally controlled oscillator DCO from the information held by the memory device 522 and output the control code DCOctrl.

Figure 8:
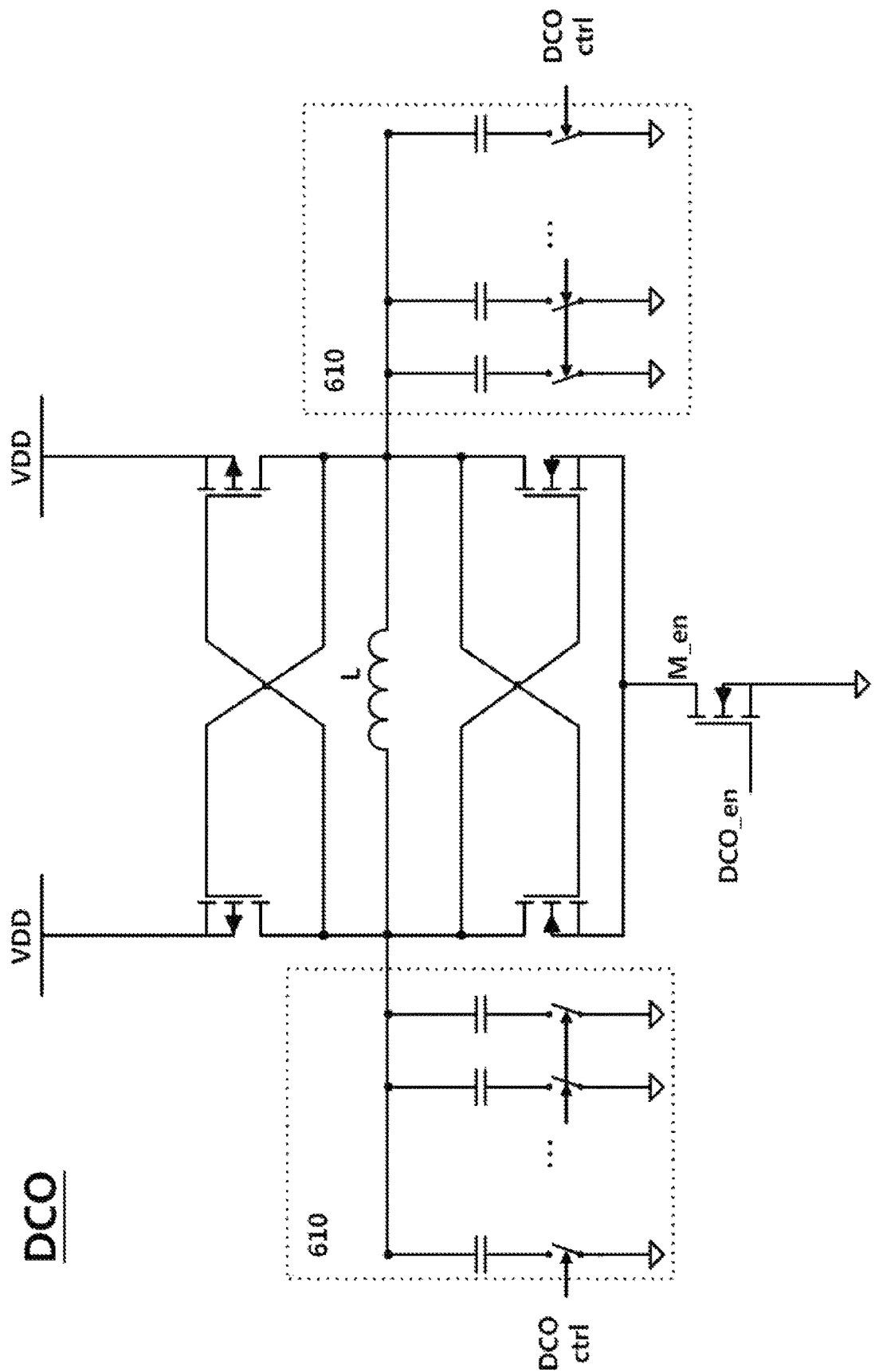
FIG. 8 is a circuit diagram schematically showing an exemplary embodiment of a digitally controlled oscillator.

FIG. 8 is a circuit diagram schematically showing an exemplary embodiment of the digitally controlled oscillator DCO. In the embodiment shown as an example in FIG. 8, the digitally controlled oscillator DCO may include an inductor L and variable capacitance units 610 in which equivalent capacitances are controlled by the control code DCOctrl provided by the digital loop filter DLF. According to an exemplary embodiment, a tail of a differential pair of the digitally controlled oscillator DCO may include an activation transistor M_en of which driving is controlled by a DCO activation signal DCO_en to control activation of the digitally controlled oscillator DCO.

In the embodiment shown as an example in FIG. 8, whether to turn on switches included in the variable capacitance units 610 is controlled by the control code DCOctrl for the digitally controlled oscillator DCO output from the digital loop filter DLF. Equivalent capacitances of the variable capacitance units 610 are controlled by turning the switches on or off such that a frequency of an output signal of the digitally controlled oscillator DCO may be controlled.

In another embodiment not shown in drawings, the variable capacitance units 610 may additionally include a varicap diode in which a voltage resulting from the control code DCOctrl is provided between an anode electrode and a cathode electrode and a thickness of a depletion layer is controlled such that a capacitance is controlled.

Figure 9:
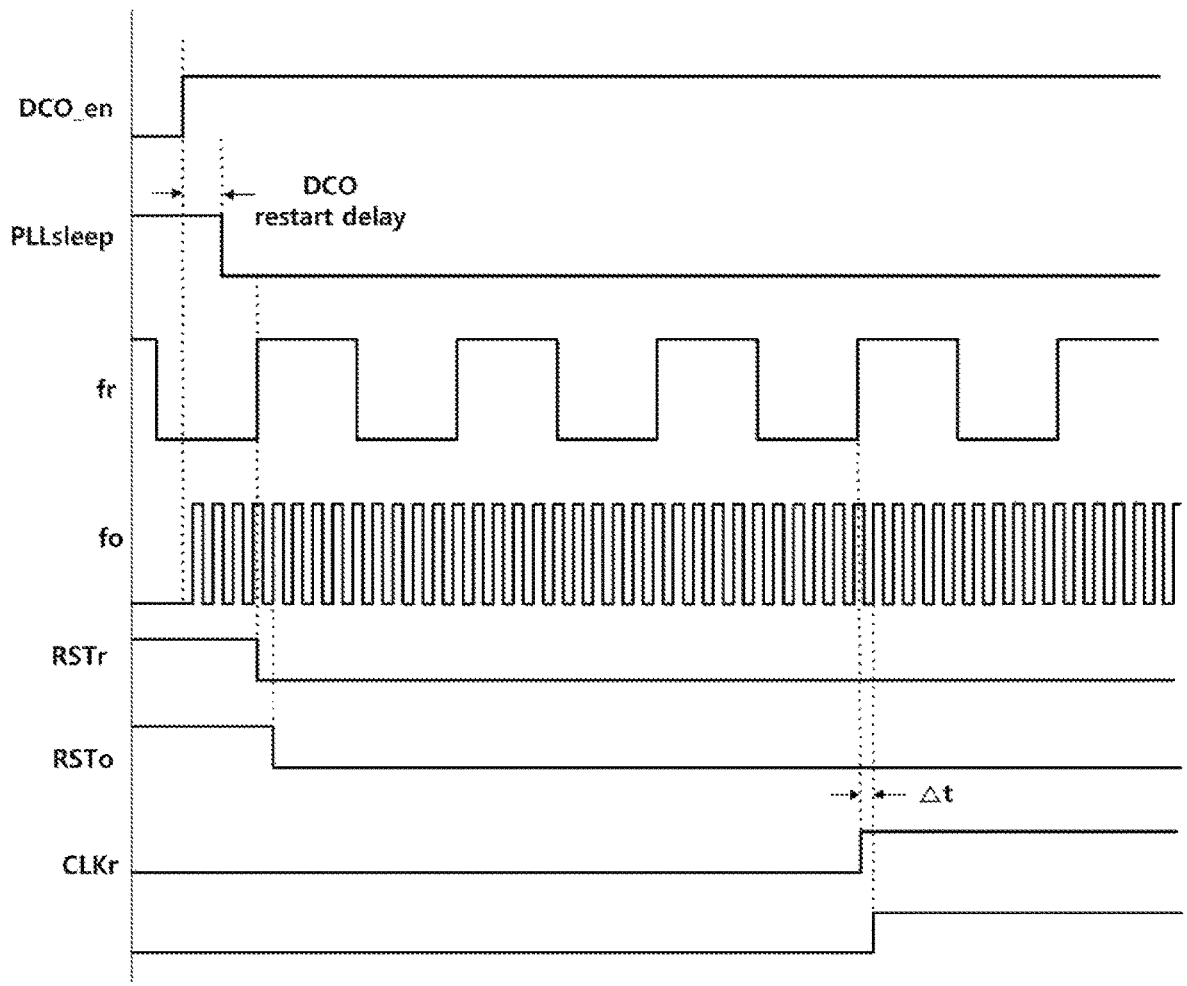
FIG. 9 is a timing diagram of a case in which a PLL according to an exemplary embodiment of the present invention is restarted.

FIG. 9 is a timing diagram of a case in which a PLL of the present embodiment is restarted. A restart operation of the PLL 2 according to the present embodiment will be described with reference to FIG. 9. The DCO activation signal DCO_en is provided, and the digitally controlled oscillator DCO is activated.

After a DCO restart delay time elapses, the sleep signal PLLsleep is switched to a low level such that the synchronizer 100 is activated. The digital loop filter DLF outputs the control code DCOctrl for the digitally controlled oscillator DCO from information corresponding to a frequency sampled and held by the memory device 522 when phase alignment is achieved.

When the synchronizer 100 is activated, the reference signal frequency divider 200 and the output signal frequency divider 300 are activated, and a frequency of the output signal fo is the same as a frequency of a case in which phase alignment has been finished before the sleep state. Therefore, a phase difference Δt between the frequency-divided reference signal CLKr output from the reference signal frequency divider 200 and the frequency-divided output signal CLKo output from the output signal frequency divider 300 may be kept smaller than that of a related art.

According to the exemplary embodiment shown in the drawings, the output signal frequency divider reset signal RSTo is generated by sampling the reference signal frequency divider reset signal RSTr with the output signal fo. Therefore, a phase difference between a falling edge of the reference signal frequency divider reset signal RSTr and a falling edge of the output signal frequency divider reset signal RSTo is within one cycle of the output signal fo. Consequently, a difference between times at which the reference signal frequency divider 200 and the output signal frequency divider 300 are activated may be within one cycle of the output signal fo.

Also, the frequency of the output signal fo is the same as a frequency of a case in which phase alignment has been finished. Since a frequency division ratio of the output signal frequency divider 300 is constant, a frequency of the frequency-divided output signal CLKo is the same as that of the previous synchronized state. Therefore, the phase difference Δt between the frequency-divided reference signal CLKr output from the reference signal frequency divider 200 and the frequency-divided output signal CLKo output from the output signal frequency divider 300 may be kept smaller than that of a related art.

When a PLL according to the related art is restarted in a sleep state, numerous iterations are made until a frequency and a phase of an output signal of the PLL coincide with a target frequency and phase, and thus a long locking time is required. On the other hand, even when restarted in a sleep state, the PLLs 1 and 2 according to the exemplary embodiments of the present invention perform phase alignment using information corresponding to a frequency of an output signal of a case in which phase alignment has been achieved in the previous active state. For this reason, a phase difference between a reference signal frequency-divided after the restart and an output signal frequency divided after the restart is reduced. Therefore, only a small number of iterations are required, and a locking time for phase alignment may be reduced. Consequently, the PLLs 1 and 2 may be rapidly restarted compared to the related art. Also, since the PLLs 1 and 2 do not operate in a sleep state, it is possible to reduce power consumption.

Third Exemplary Embodiment

A delay-locked loop (DLL) 3 according to a third exemplary embodiment of the present invention will be described below with reference to accompanying drawings. For clear and simple description, descriptions identical or similar to those of the above-described exemplary embodiments will be omitted, and elements which perform like or similar functions may be described with reference to drawings of previous embodiments.

Figure 10:
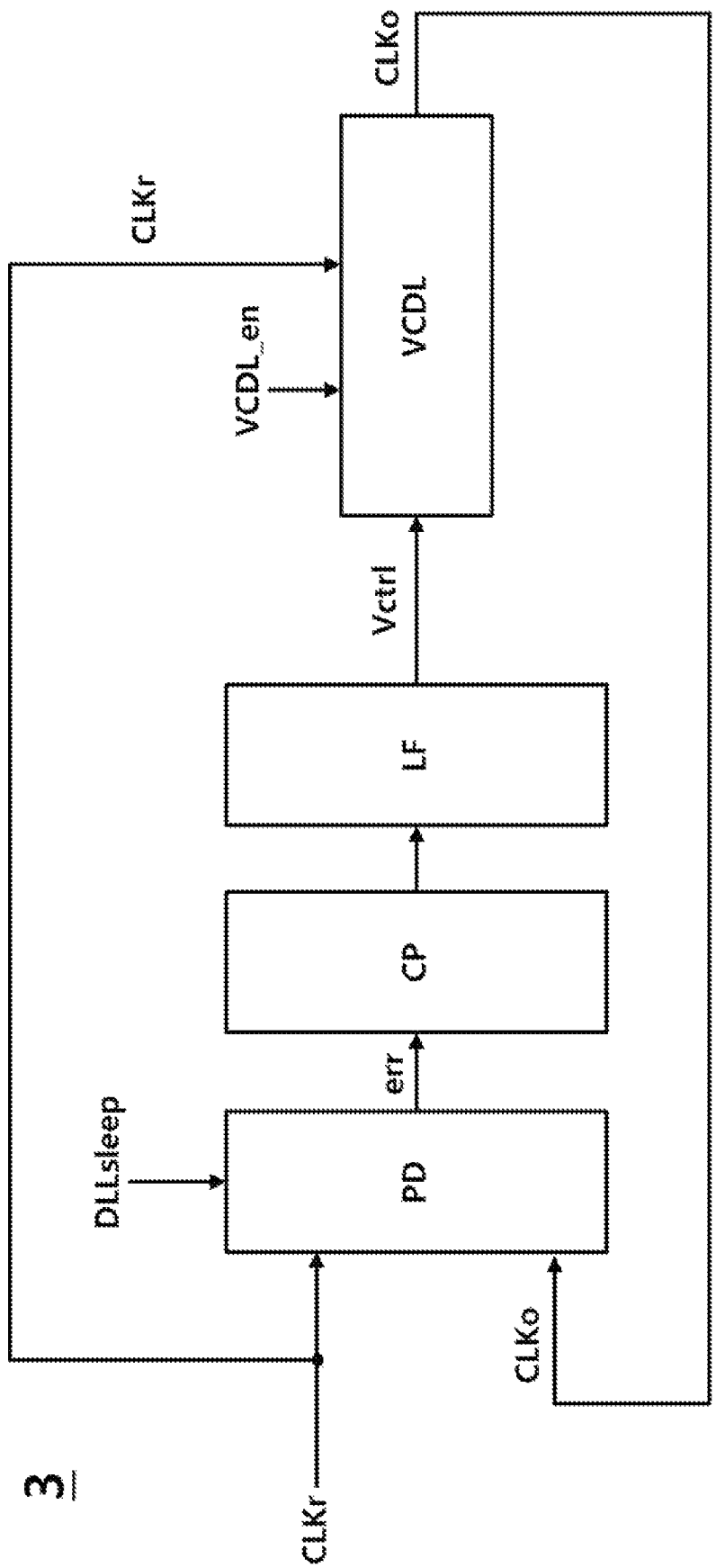
FIG. 10 is a block diagram showing an overview of a delay-locked loop (DLL) according to an exemplary embodiment of the present invention.

FIG. 10 is a block diagram showing an overview of the DLL 3 according to the present embodiment. Referring to FIG. 10, the DLL 3 according to the present embodiment may include a phase detector PD, a charge pump CP, a loop filter LF, and a voltage controlled delay line VCDL.

The phase detector PD detects a phase difference between a reference signal CLKr and an output signal CLKo provided as input and outputs an error signal err corresponding to the phase difference. As an exemplary embodiment, activation of the phase detector PD may be controlled by a sleep signal DLLsleep. The error signal err may be a pump-up signal for controlling the charge pump CP to provide electric charges or a pump-down signal for controlling the charge pump CP to receive electric charges.

Figure 11:
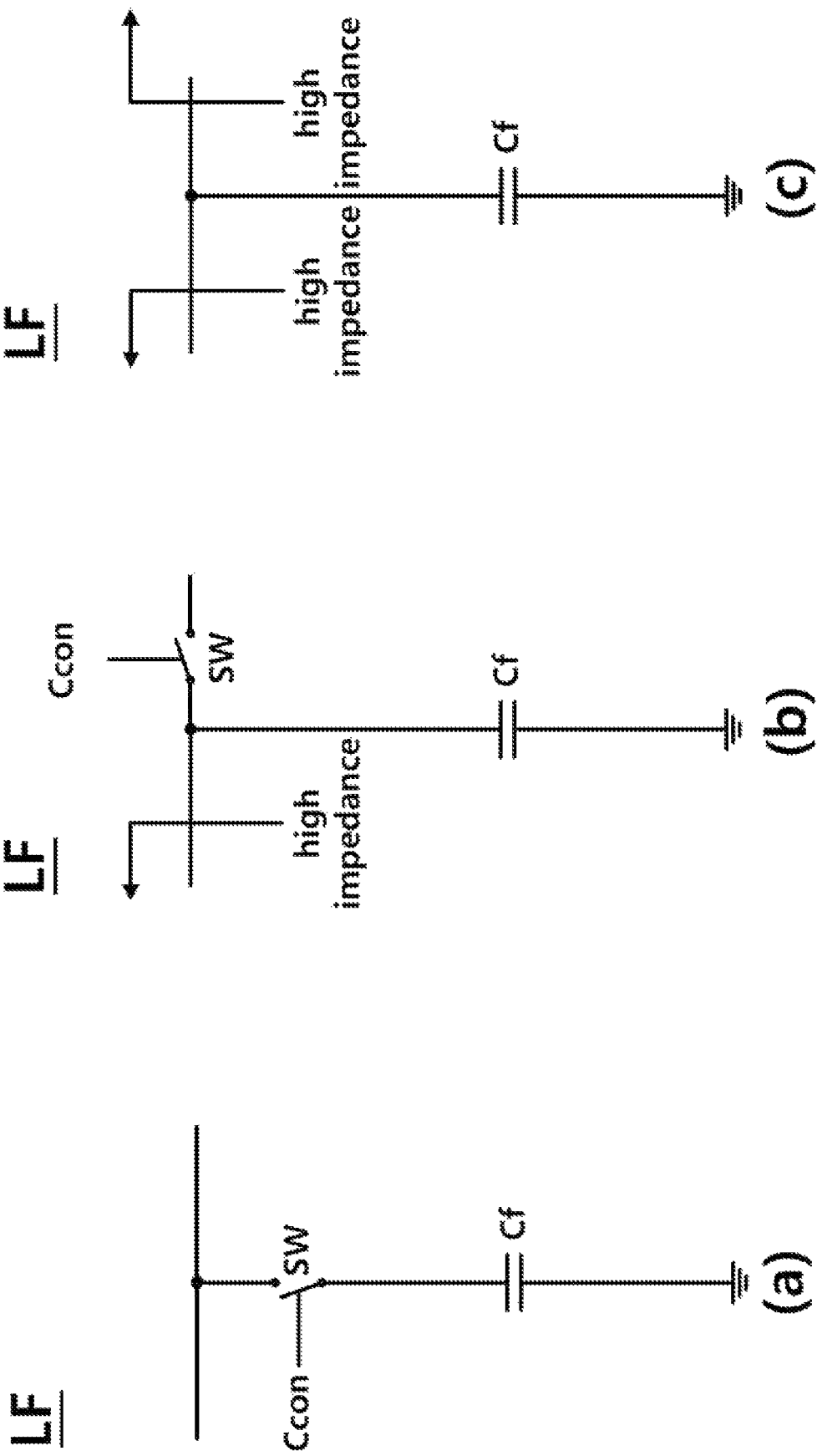
FIG. 11 is a set of circuit diagrams showing overviews of loop filters according to an exemplary embodiment of the present invention.

FIGS. 11A, 11B, and 11C are circuit diagrams showing overviews of the loop filter LF according to the present embodiment. Referring to FIGS. 11A and 11B, the loop filter LF includes a capacitor Cf and a switch SW, and whether the switch SW is turned on or off is controlled by a switch control signal Ccon. According to the exemplary embodiment shown in FIG. 11A, the switch SW may be positioned so that the capacitor Cf may be connected to or cut off from the previous stage and the subsequent stage. As shown in the embodiment exemplified in FIG. 11B, the switch SW may be positioned to cut off a connection with a stage subsequent to the loop filter LF. According to another exemplary embodiment, it is possible to prevent discharge of a voltage stored in the loop filter LF by making output impedances of the previous stage and the subsequent stage of the loop filter LF high.

The loop filter LF receives a current signal output from the charge pump CP, removes noise from the current signal, generates a voltage signal from the current signal, and provides the voltage signal to the voltage controlled delay line VCDL. The voltage signal formed at the capacitor Cf of the loop filter LF corresponds to a delay time of the voltage controlled delay line VCDL. Therefore, a VCDL control signal Vctrl output from the loop filter LF functions to control a delay time of a signal output from the voltage controlled delay line VCDL so that phases of the output signal CLKo and the reference signal CLKr may be aligned.

When the DLL 3 alternately operates in an active state and a sleep state, phase alignment is achieved in an active state. After that, when or as soon as the DLL 3 enters a sleep state, the control signal Ccon may be provided to turn off the switch SW. Then, it is possible to prevent discharge of electric charges stored in the loop filter LF and to maintain information on a delay time of a case in which phase alignment has been achieved.

When the DLL 3 switches from the sleep state to an active state, the control signal Ccon is provided to turn on the switch SW. Then, the VCDL control signal Vctrl output from the loop filter LF causes the voltage controlled delay line VCDL to have the delay time of the previous active state in which phase alignment has been achieved.

Figure 12:
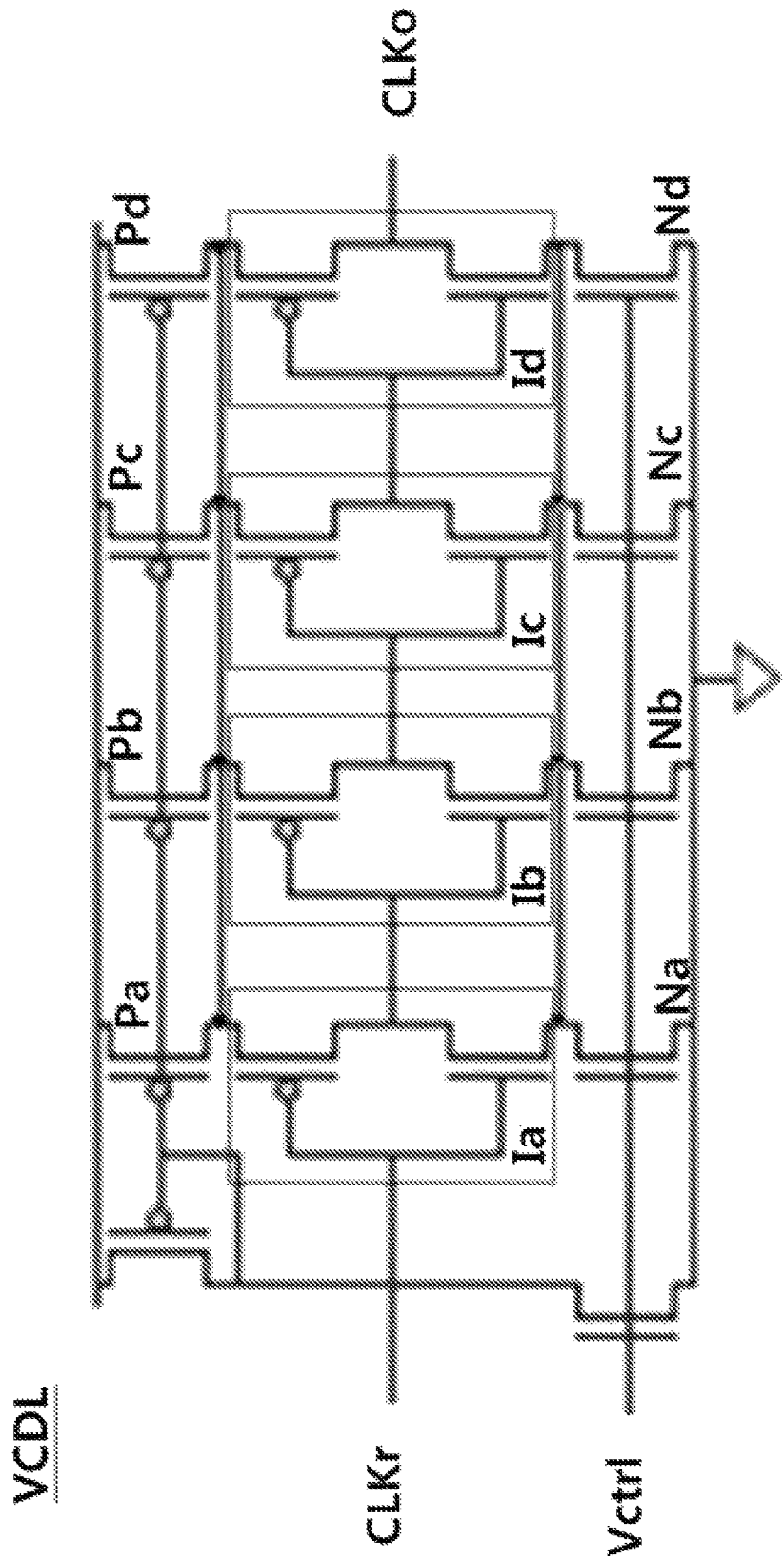
FIG. 12 is a circuit diagram schematically showing an exemplary embodiment of a voltage controlled delay line.

FIG. 12 is a circuit diagram schematically showing an exemplary embodiment of the voltage controlled delay line VCDL. Referring to FIG. 12, the voltage controlled delay line VCDL includes inverters Ia, Ib, Ic, and Id which are cascaded to invert the reference signal CLKr provided as an input. The inverters Ia, Ib, Ic, and Id are respectively connected to P-type metal oxide semiconductor (PMOS) transistors Pa, Pb, Pc, and Pd which mirror a current, and a bias current is provided to the inverters Ia, Ib, Ic, and Id. Also, the inverters Ia, Ib, Ic, and Id are respectively connected to N-type metal oxide semiconductor (NMOS) transistors Na, Nb, Nc, and Nd which drain the bias current, and the VCDL control signal Vctrl is provided to gates of the NMOS transistors Na, Nb, Nc, and Nd.

The VCDL control signal Vctrl is provided to the gates of the NMOS transistors Na, Nb, Nc, and Nd and controls turn-on resistances of the NMOS transistors Na, Nb, Nc, and Nd. Therefore, a current drained by the NMOS transistors Na, Nb, Nc, and Nd is controlled, and the bias current provided to the inverters Ia, Ib, Ic, and Id is adjusted such that a delay of each inverter is controlled.

As an example, when the VCDL control signal Vctrl is provided to reduce the turn-on resistances of the NMOS transistors Na, Nb, Nc, and Nd, the bias current provided to the inverters Ia, Ib, Ic, and Id is increased, and an output delay of each inverter stage is reduced such that a delay time for an input signal shortens. As another example, when the VCDL control signal Vctrl is provided to increase the turn-on resistances of the NMOS transistors Na, Nb, Nc, and Nd, the bias current provided to the inverters Ia, Ib, Ic, and Id is reduced, and an output delay of each inverter stage is increased such that a delay time for an input signal lengthens.

Therefore, if the loop filter LF stores a voltage of a case in which phase locking has been achieved, enters a sleep state, and then is activated again, the voltage may be provided to the voltage controlled delay line VCDL. Then, the voltage controlled delay line VCDL operates with a delay time of the case in which phase locking has been achieved.

Figure 13:
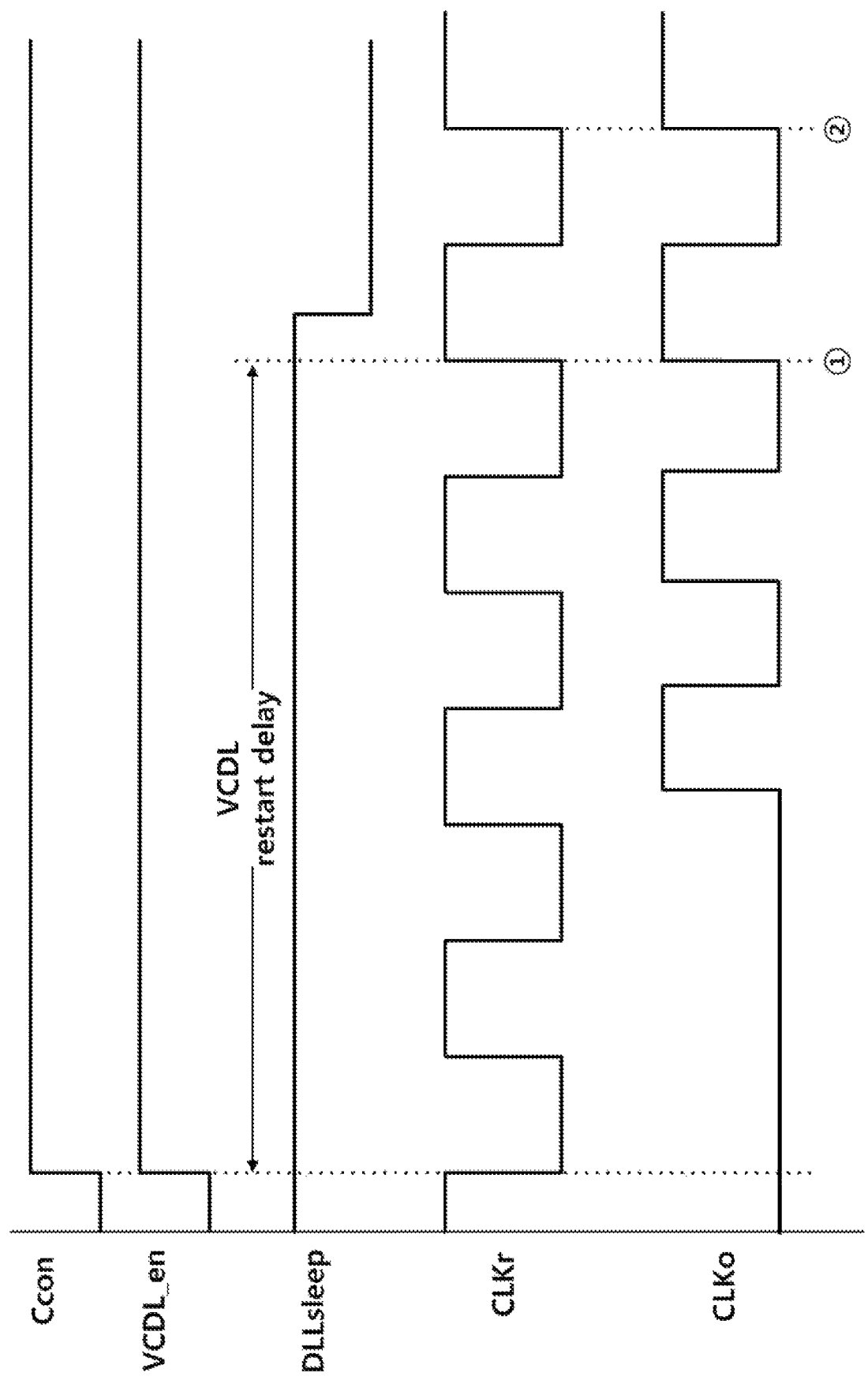
FIG. 13 is a schematic timing diagram illustrating operation of a DLL according to an exemplary embodiment of the present invention.

FIG. 13 is a schematic timing diagram illustrating operation of the DLL 3 according to the present embodiment. Referring to FIG. 13, to restart the DLL 3 in a sleep state, the voltage controlled delay line VCDL is activated by switching a VCDL activation signal VCDL_en to a high level. According to an exemplary embodiment, the switch control signal Ccon is provided so that the VCDL control signal Vctrl, which is generated by charging the loop filter LF, may be provided to the voltage controlled delay line VCDL.

To ensure a restart time of the voltage controlled delay line VCDL, the voltage controlled delay line VCDL deviates from a sleep state after a VCDL restart delay time elapses. The VCDL restart delay time may be one cycle of the reference signal CLKr or more. The voltage controlled delay line VCDL is activated within the VCDL restart delay time and delays an input signal for the same delay time as in a previous active state due to the VCDL control signal Vctrl.

In an exemplary embodiment indicated by ① in FIG. 13, phase alignment between the reference signal CLKr and the output signal CLKo may be achieved immediately after the VCDL restart delay time. According to another exemplary embodiment indicated by ② in FIG. 13, unlike the exemplary embodiment indicated by ①, phase alignment may not be achieved immediately after the restart delay time due to a non-ideal characteristic of the DLL 3 including the voltage controlled delay line VCDL. However, a phase difference between the reference signal CLKr and the output signal CLKo caused by the non-ideal characteristic is slight. Therefore, phase alignment may be finished within one cycle of the reference signal CLKr and/or the output signal CLKo.

After the VCDL restart delay time, the sleep signal DLLsleep is switched to a low level. The phase detector PD is activated and may detect that phase alignment has been achieved between the reference signal CLKr and the output signal CLKo. When the sleep signal DLLsleep is at a high level, the phase detector PD does not generate an error signal. Therefore, the sleep signal DLLsleep is kept at the high level until the voltage controlled delay line VCDL is restarted.

Fourth Exemplary Embodiment

A digital DLL 4 according to a fourth exemplary embodiment of the present invention will be described below with reference to accompanying drawings. For clear and simple description, descriptions identical or similar to those of the above-described exemplary embodiments will be omitted, and elements which perform like or similar functions may be described with reference to drawings of previous embodiments.

Figure 14:
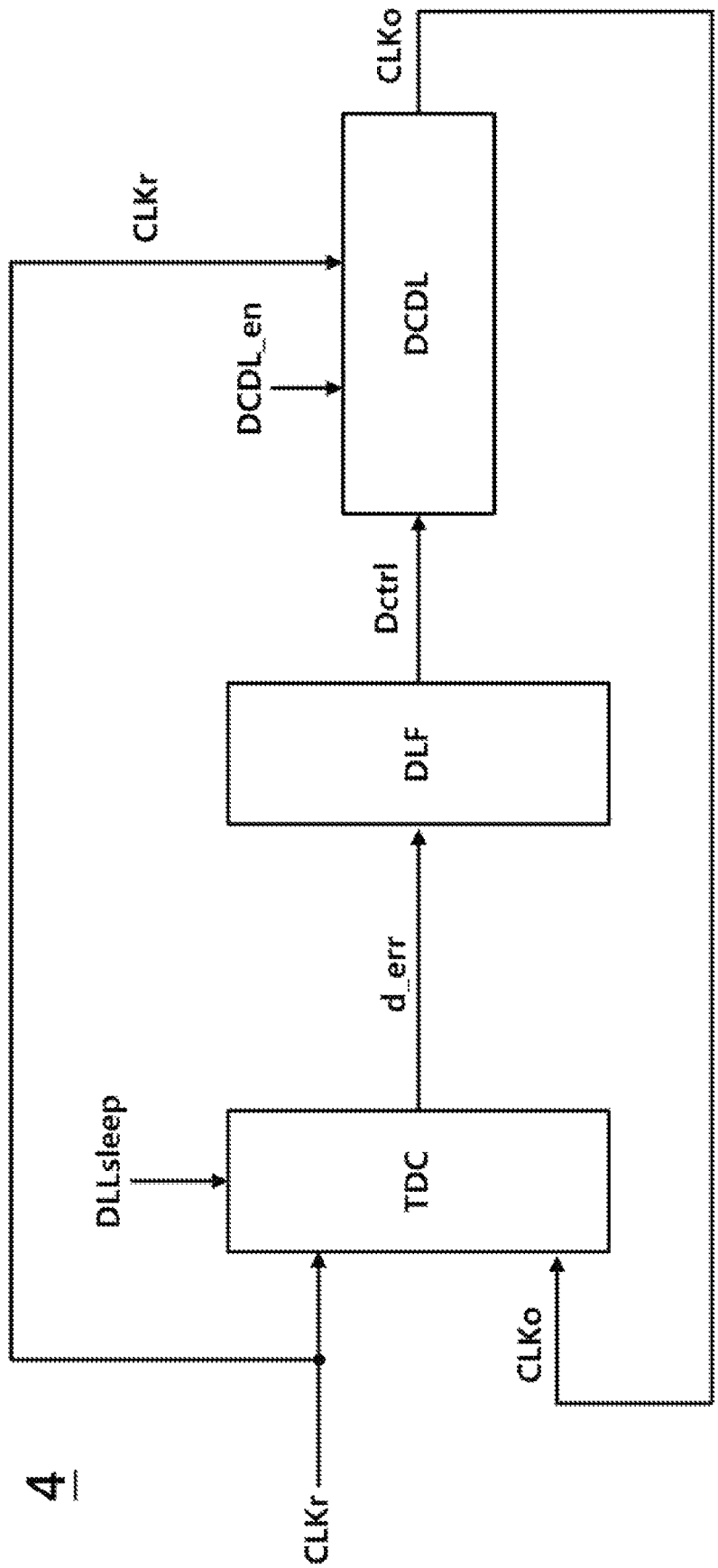
FIG. 14 is a block diagram showing an overview of a DLL according to an exemplary embodiment of the present invention.

FIG. 14 is a block diagram showing an overview of the DLL 4 according to the present embodiment. Referring to FIG. 14, the digital DLL 4 includes a time-to-digital converter TDC, a digital loop filter DLF, and a digitally converted delay line DCDL.

The time-to-digital converter TDC detects a phase difference between a reference signal CLKr and an output signal CLKo provided as input and outputs an error code d_err which is a digital code corresponding to the detected phase difference.

The digital loop filter DLF receives the error code d_err as an input and generates a control code Dctrl for controlling a delay time of the digitally controlled delay line DCDL. As an exemplary embodiment, the digital loop filter DLF includes an integral path 520 (see FIG. 7) which has a gain of β, includes a memory device 522 (see FIG. 7), and adjusts a delay time of the digitally controlled delay line DCDL.

Information stored in the memory device 522 corresponds to a delay time of the digitally controlled delay line DCDL when phase alignment has been achieved before a sleep state of the DLL 4 according to the present embodiment. Before the DLL 4 enters a sleep state, the memory device 522 samples and holds a signal output from the integral path 520 such that information corresponding to a delay time of a case in which phase alignment has been achieved may be stored. Therefore, with the information stored in the memory device 522, it is possible to recover delay information of a case in which phase alignment has been achieved before a sleep state.

Figure 15:
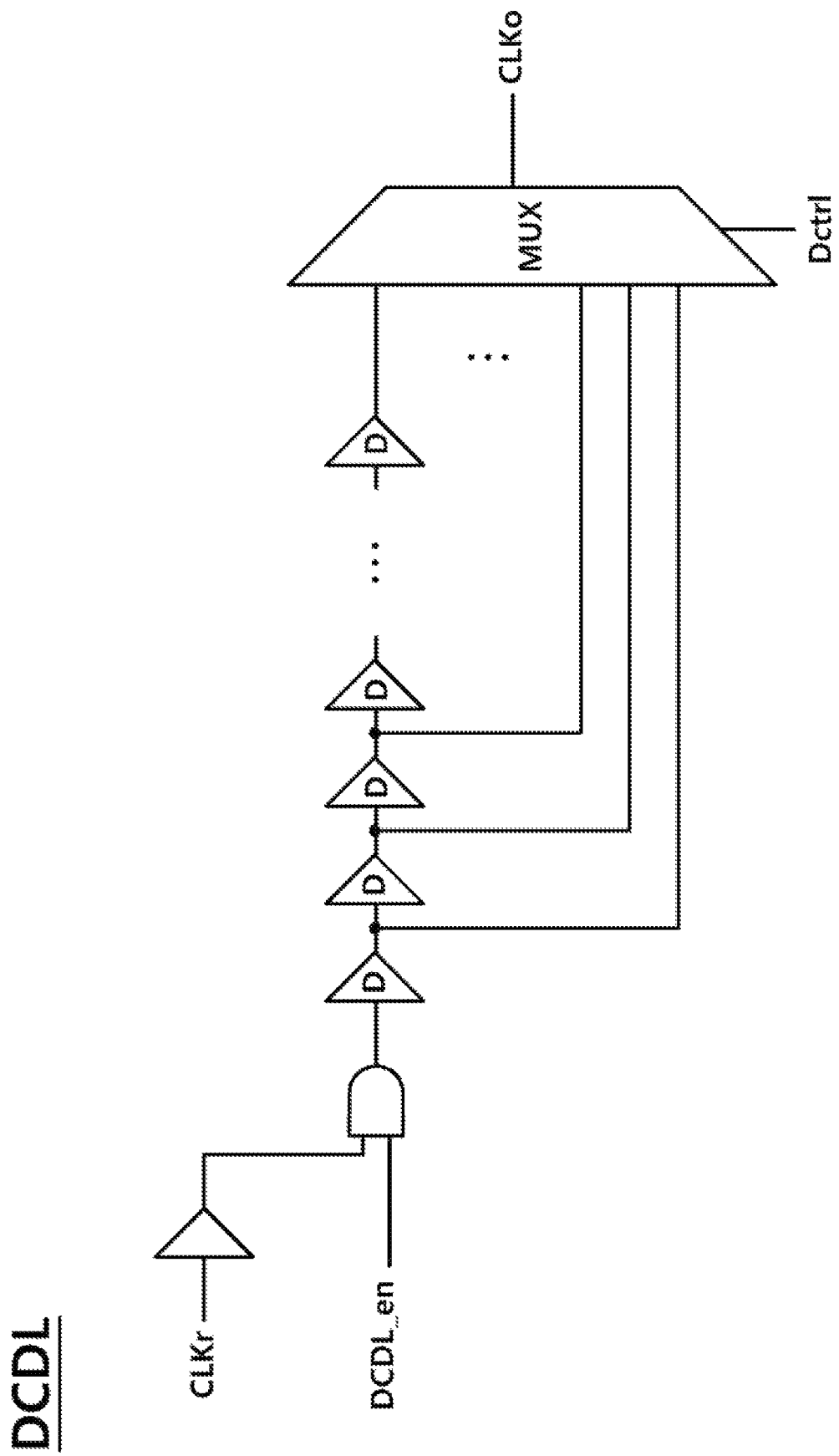
FIG. 15 is a diagram showing an overview of a digitally controlled delay line.

FIG. 15 is a block diagram of the DLL 4 of the present embodiment showing an overview of the digitally controlled delay line DCDL. Referring to FIG. 15, the digitally controlled delay line DCDL includes a plurality of cascaded unit delay elements D. Each of the unit delay elements D delays and outputs a signal provided as an input. A signal delayed and output by each of the unit delay elements D is provided as an input to a multiplexer MUX.

A DCDL activation signal DCDL_en is provided to the digitally controlled delay line DCDL to control activation thereof, and the control code Dctrl is provided to the multiplexer MUX such that a signal obtained by delaying the reference signal CLKr for a delay time corresponding to the control code Dctrl may be selected and output. Therefore, if the digital loop filter DLF stores the control code Dctrl of a case in which phase alignment has been achieved and then outputs the stored control code Dctrl when restarted after a sleep state, the digitally controlled delay line DCDL may delay the reference signal CLKr for the same time as in a case in which phase locking has been achieved and output the delayed reference signal CLKr.

Figure 16:
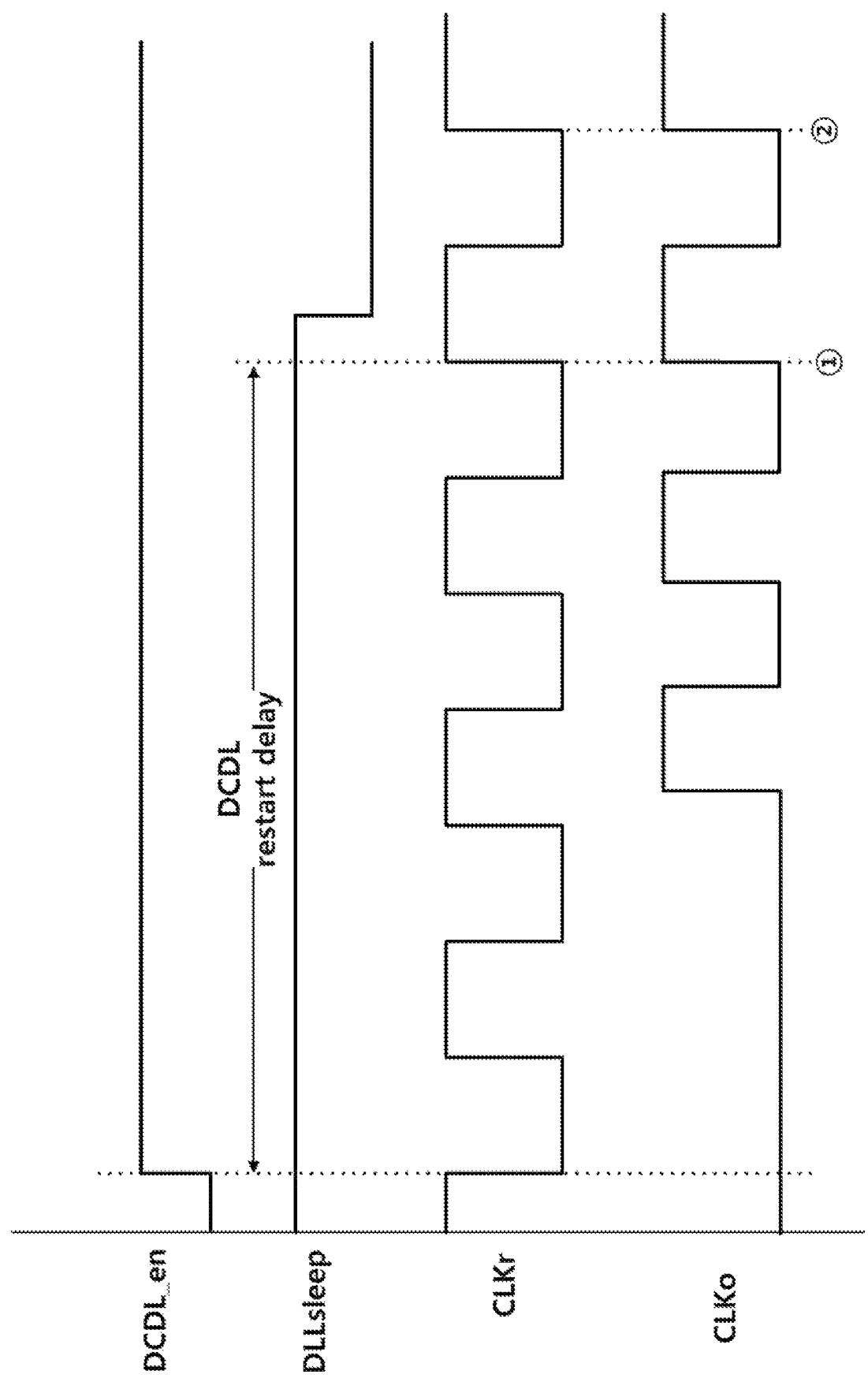
FIG. 16 is a schematic timing diagram illustrating operation of a DLL according to an exemplary embodiment of the present invention.

FIG. 16 is a schematic timing diagram of the DLL 4 according to the present embodiment. Referring to FIG. 16, to restart the DLL 4 in a sleep state, the digitally controlled delay line DCDL is activated by switching the DCDL activation signal DCDL_en to a high level.

To ensure a restart time of the digitally controlled delay line DCDL, the digitally controlled delay line DCDL deviates from a sleep state after a DCDL restart delay time elapses. In the embodiment shown as an example in FIG. 16, the DCDL restart delay time is 4.5 cycles of the reference signal CLKr. However, this is only an example, and the DCDL restart delay time may be longer or shorter than 4.5 cycles of the reference signal CLKr.

The digitally controlled delay line DCDL is activated within the DCDL restart delay time and has the same delay time as in a previous active state in which phase alignment has been achieved. At this time, phase alignment is achieved between the reference signal CLKr and the output signal CLKo.

In an exemplary embodiment indicated by ① in FIG. 16, phase alignment between the reference signal CLKr and the output signal CLKo may be achieved immediately after the DCDL restart delay time. According to another exemplary embodiment indicated by ② in FIG. 16, unlike the exemplary embodiment indicated by ①, phase alignment may not be achieved immediately after the restart delay time due to a non-ideal characteristic of the DLL 4 including the digitally controlled delay line DCDL. However, a phase difference between the reference signal CLKr and the output signal CLKo caused by the non-ideal characteristic is slight. Therefore, phase alignment may be finished within one cycle of the reference signal CLKr and/or the output signal CLKo.

After the DCDL restart delay time, the sleep signal DLLsleep is switched to a low level such that the time-to-digital converter TDC may detect that phase alignment has been achieved between the reference signal CLKr and the output signal CLKo.

When a DLL according to a related art is restarted in a sleep state, numerous iterations are made to align a phase of an output signal with a phase of a reference signal. On the other hand, the DLLs 3 and 4 according to the exemplary embodiments of the present invention store information corresponding to a delay time of a case in which phase alignment has been achieved and perform phase alignment using the stored information upon restarting.

Therefore, the number of iterations made by the DDLs 3 and 4 is reduced, and phase alignment may be rapidly performed. Also, it is possible to reduce power consumption.

According to exemplary embodiments of the present invention, even when a PLL and/or a DLL alternately operates in a sleep state and an active state, it is possible to perform frequency and/or phase alignment within a short locking time. Also, according to exemplary embodiments of the present invention, when a PLL and/or a DLL is in a sleep state, it is unnecessary for the PLL and/or the DLL to operate, and thus power consumption can be reduced.

Although exemplary embodiments of the present invention have been described in detail with reference to the accompanying drawings, the embodiments are merely examples, and those of ordinary skill in the art will appreciate that various modifications and equivalents may be made from the exemplary embodiments. Therefore, the technical scope of the present invention should be determined by the following claims.

What is claimed is:

1. A phase-locked loop which alternately operates in a sleep state and an active state,
    wherein a frequency-divided output signal of the phase-locked loop is synchronized with a frequency-divided reference signal,
    when the phase-locked loop switches from a sleep state to an active state, a frequency of the frequency-divided output signal is identical to a frequency of a frequency-divided output signal which has been synchronized in a previous active state,
    wherein information corresponding to the frequency of the frequency-divided output signal which has been synchronized in the previous active state is stored in a capacitor,
    wherein the phase-locked loop comprises:
        a reference signal frequency divider configured to divide a frequency of a reference signal; and
        an output signal frequency divider configured to divide a frequency of an output signal of the phase-locked loop, wherein the frequency-divided output signal is synchronized with the frequency-divided reference signal, wherein a sleep signal is provided to control the sleep state and the active state of the phase-locked loop, wherein the phase-locked loop further comprises a synchronizer configured to receive the sleep signal and generate a reference signal frequency divider activation signal for activating the reference signal frequency divider and an output signal frequency divider activation signal for activating the output signal frequency divider, and wherein the synchronizer comprises:
- a first flip-flop configured to receive the sleep signal, sample the sleep signal with the reference signal, and output the reference signal frequency divider activation signal; and
- a second flip-flop configured to receive the reference signal frequency divider activation signal, sample reference signal frequency divider activation signal with the output signal, and output the output signal frequency divider activation signal.

2. The phase-locked loop of claim 1, further comprising a loop filter, wherein the capacitor is included in the loop filter.

3. The phase-locked loop of claim 2, wherein the phase-locked loop is an analog phase-locked loop.

* * * * *